(12) United States Patent
Sato (10) Patent No.: US 7,829,878 B2
(45) Date of Patent: Nov. 9, 2010

(54) SEMICONDUCTOR DEVICE AND MANUFACTURE METHOD THEREOF

(75) Inventor: Natsuki Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 573 days.

(21) Appl. No.: 11/845,120

(22) Filed: Aug. 27, 2007

(65) Prior Publication Data

US 2008/0048168 A1   Feb. 28, 2008

(30) Foreign Application Priority Data

Aug. 25, 2006   (JP) ............................. 2006-228736

(51) Int. Cl.
*H01L 47/00* (2006.01)
(52) U.S. Cl. .................... 257/4; 257/E45.002; 438/872
(58) Field of Classification Search ..................... 257/2, 257/3, 4, 209, 529, 751, E45.002; 438/95, 438/672, 675

See application file for complete search history.

(56) References Cited

U.S. PATENT DOCUMENTS 7,348,590 B2 *   3/2008   Happ ............................. 257/4

FOREIGN PATENT DOCUMENTS

| JP | 10-27805 | 1/1998 |
|---|---|---|
| JP | 2004-158852 | 6/2004 |
| JP | 2004-349709 | 12/2004 |
| JP | 2005-244235 | 9/2005 |
| JP | 2006-510218 | 3/2006 |
| JP | 2006-510219 | 3/2006 |
| WO | WO 2006/027887 | 3/2006 |

* cited by examiner

*Primary Examiner*—David Vu
(74) *Attorney, Agent, or Firm*—Young & Thompson (57) ABSTRACT

A semiconductor device includes an interlayer insulating film formed on a semiconductor substrate to cover a lower electrode, a side-wall insulating film formed on a side wall of a contact hole formed through the interlayer insulating film to a depth reaching the lower electrode, a heater formed in the interior of the contact hole defined by the side-wall insulating film, and a phase-change film in contact with the top surface of the heater. The heater is in contact with the lower electrode at the bottom surface within the contact hole, and the top surface thereof is located at a lower level than that of the top surface of the side-wall insulating film. The top surface of the heater is located at a lower level than the top surface of the side-wall insulating film by an extent equal to or greater than a thickness of the phase-change film.

14 Claims, 7 Drawing Sheets

SEMICONDUCTOR DEVICE AND MANUFACTURE METHOD THEREOF

This application is based upon and claims the benefit of priority from Japanese patent application No. 2006-228736 filed on Aug. 25, 2006, the disclosure of which is incorporated herein in its entirety by reference.

BACKGROUND OF THE INVENTION

1. Field of the Invention

The present invention relates to a semiconductor device and a manufacture method thereof, and in particular to a semiconductor device having a nonvolatile memory using a phase-change material and a manufacture method thereof.

2. Description of the Related Art

Semiconductor memories for use in semiconductor devices include volatile memories which lose stored information when power is removed, and nonvolatile memories which retain information even when power is removed. The volatile memories include a dynamic random access memory (DRAM) and a static random access memory (SRAM), while the nonvolatile memories include an electrically erasable programmable read only memory (EEPROM) and a flash memory. Most of recent portable information terminal devices employ a flash memory which retains stored information when power is removed, for the purpose of size reduction and power saving.

Recently, however, phase-change memories using a phase-change material have become to attract attention in order to pursue further size reduction and power saving. A phase-change memory is a nonvolatile memory which utilizes two different reversible phase changes of a phase-change material to store information. The phase-change material is changed to either the amorphous state with high resistance or to the crystalline state with low resistance to thereby store information of "1" or "0". A chalcogenide material is used as such phase-change material The rewrite of a phase-change memory is performed by supplying sufficient Joule heat to the phase-change material to once melt the same, and then quenching the molten material to the amorphous state (reset state) with high resistance. The phase-change material is converted to the crystalline state (set state) with low resistance by supplying slightly less Joule heat thereto and then annealing the same. The quantity of supplied heat and the cooling rate are controlled by the current value and length (duration) of a pulse applied to the phase-change material. The rewrite of the memory is thus performed by converting the phase-change material to the amorphous state or the crystalline state to change the resistance thereof. The read of the phase-change memory is performed by utilizing the fact that the current value is different between the amorphous state and the crystalline state of the phase-change material.

Figure 1:
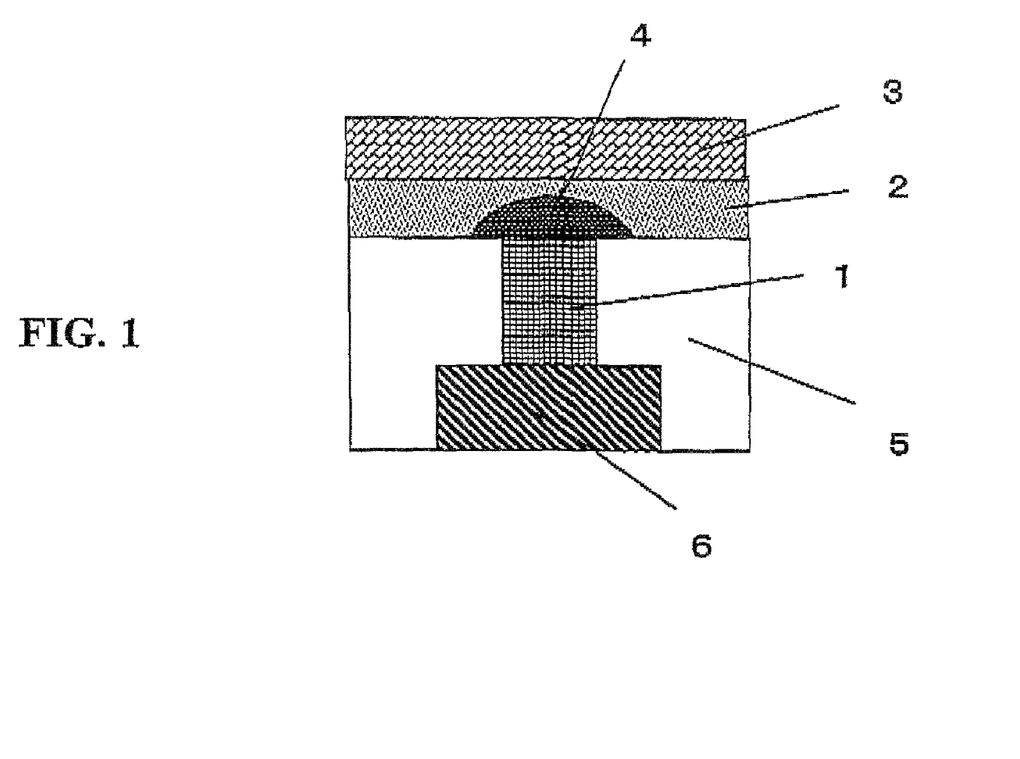
FIG. 1 is a partial cross-sectional view showing a phase-change memory cell according to a related art.

FIG. 1 is a partial cross-sectional view showing a principal part of a conventional phase-change memory cell. A lower electrode 6 is covered with an interlayer insulating film 5, which is formed with a contact hole. A heater electrode 1 is formed in the contact hole. The top surface of the heater electrode 1 is made flush with the top surface of the interlayer insulating film 5, and a phase-change film 2 and an upper electrode 3 are formed on the top surface thereof. The interlayer insulating film 5 is for example a silicon oxide film ($SiO_2$). One end of the heater electrode 1 is connected to the lower electrode 6 while the other end is connected to the phase-change film 2. The phase-change film 2 is connected to the upper electrode 3, The heater electrode 1 generates heat due to Joule heat evolved when voltage is applied between the lower electrode 6 and the upper electrode 3, whereby the crystal phase of the phase-change film 2 is changed. The change of the crystal phase of the phase-change film 2 changes the electrical resistance of the phase-change film 2. A region in which the crystal phase of the phase-change film 2 is changed is indicated as a phase-change region 4. A temperature of about 600° C. or higher is required to change the crystal phase of the phase-change film 2. Thus, the phase-change region 4 is defined by a region in the phase-change film 2 on and surrounding the contact surface between the heater electrode 1 and the phase-change film 2. The heater electrode 1 is formed of a material having an appropriate resistance, such as titanium silicon nitride, or tantalum nitride.

Figure 2:
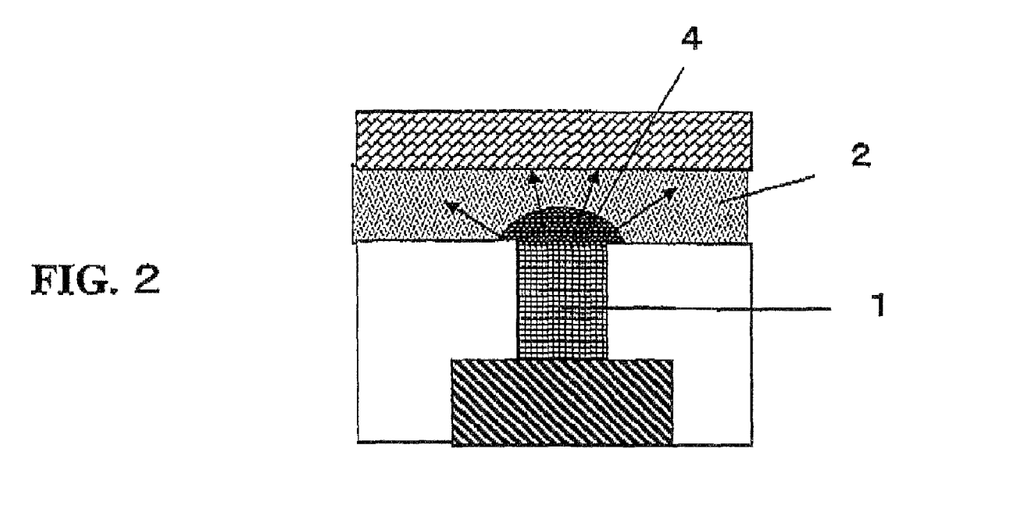
FIG. 2 is an explanatory diagram illustrating how heat is diffused in the phase-change memory cell of FIG. 1.

In the conventional phase-change memory, however, the phase-change film 2 is formed flat on the flat top surface of the heater electrode 1. Therefore, as indicated by the arrows in FIG. 2, the phase-change region 4 is also extended laterally, and heat is diffused to the upper side. When the phase-change region is extended and heat is diffused in this manner, heat generated by the heater electrode cannot be concentrated exclusively to the small phase-change region only, resulting in low efficiency of heat generation. It is therefore a crucial problem for the phase-change memories to develop a phase-change memory cell having a heater electrode and a phase-change film, which has a small phase-change region and is capable of efficient heat generation with a small amount of current.

The following patent documents are known as prior art documents relating to such phase-change memories. Japanese Kokai Patent Publication No. 2005-244235 (Patent Document 1) discloses a technique in which a spacer and a heater electrode are formed within a contact hole formed through an interlayer insulating film so that the heater electrode is in contact with a flat phase-change film. Japanese Kohyo Patent Publication No. 2006-510219 (Patent Document 2) discloses a technique in which a contact hole is formed through an interlayer insulating film on a heater electrode, and a spacer and a phase-change film are formed within the contact hole. Japanese Kohyo Patent Publication No. 2006-510218 (Patent Document 3) discloses a technique in which a conductor and a heater electrode are formed within a contact hole through an interlayer insulating film, and the heater electrode is in contact with a flat phase-change film.

SUMMARY OF THE INVENTION

It is a crucial problem for the phase-change memories as described above to obtain a phase-change memory cell having a heater electrode and a phase-change film, which has a small phase-change region and is capable of efficient heat generation with a small amount of current.

In view of these problems, it is an exemplary object of the present invention to provide a semiconductor device having a phase-change memory which can be rewritten with a small amount of current.

It is another exemplary object of the present invention to provide a manufacture method of a semiconductor device having a phase-change memory, which is easy to produce in mass and yet capable of stable operation.

A semiconductor device according to an exemplary aspect of the invention includes: an interlayer insulating film formed over a semiconductor substrate so as to cover a lower electrode; a side-wall insulating film formed on a side wall of a contact hole having a depth reaching the lower electrode through the interlayer insulating film; a heater formed in the interior of the contact hole defined by the side-wall insulating film; a phase-change film formed in contact with the top surface of the heater; and an upper electrode formed in contact with the top surface of the phase-change film. The heater is formed such that it is connected to the lower electrode at the bottom surface thereof, and the level of the top surface of the heater is lower than the level of the top surface of the side-wall insulating film.

According to another exemplary aspect of the invention, a semiconductor device having a memory cell includes: a semiconductor substrate; a lower electrode over the semiconductor substrate; an interlayer insulating film over the semiconductor substrate and the lower electrode; an opening formed in the interlayer insulating film to a depth reaching the lower electrode; a side-wall insulating film formed on a side wall of the opening; a heater being in contact with the lower electrode at the bottom surface of the remaining opening inside the side-wall insulating film and buried in the remaining opening such that the height of the heater is lower than that of the side-wall insulating film; and a phase-change material film formed to be in contact with the top surface of the heater.

According to still another exemplary aspect of the invention, there is provided a manufacture method of a semiconductor device including the steps of: forming an interlayer insulating film so as to cover a lower electrode formed over a semiconductor substrate; forming a side-wall insulating film on a side wall of a contact hole having a depth reaching the lower electrode through the interlayer insulating film; forming a heater film in the interior of the contact hole defined by the side-wall insulating film, and etching the heater film to form a heater; forming a phase-change film in contact with the top surface of the heater; and forming an upper electrode on the top surface of the phase-change film. The heater is formed such that it is connected to the lower electrode at the bottom surface thereof, and the level of the top surface of the heater is lower than the level of the top surface of the side-wall insulating film.

According to yet another exemplary aspect of the invention, a manufacture method of a semiconductor device having a memory cell includes the steps of: forming an interlayer insulating film so as to cover a lower electrode formed over a semiconductor substrate; forming a contact hole through the interlayer insulating film to a depth reaching the lower electrode; forming a side-wall insulating film on a side wall of the contact hole; forming a heater in the interior of the contact hole defined by the side-wall insulating film such that the heater is in contact with the lower electrode at the bottom surface of the contact hole and the heater has its top surface at a lower level than that of the top surface of the side-wall insulating film; and forming a phase-change film in contact with the top surface of the heater.

DESCRIPTION OF THE EXEMPLARY EMBODIMENTS

A semiconductor device and a manufacture method thereof of the present invention will be described in detail with reference to the accompanying drawings.

Figure 3:
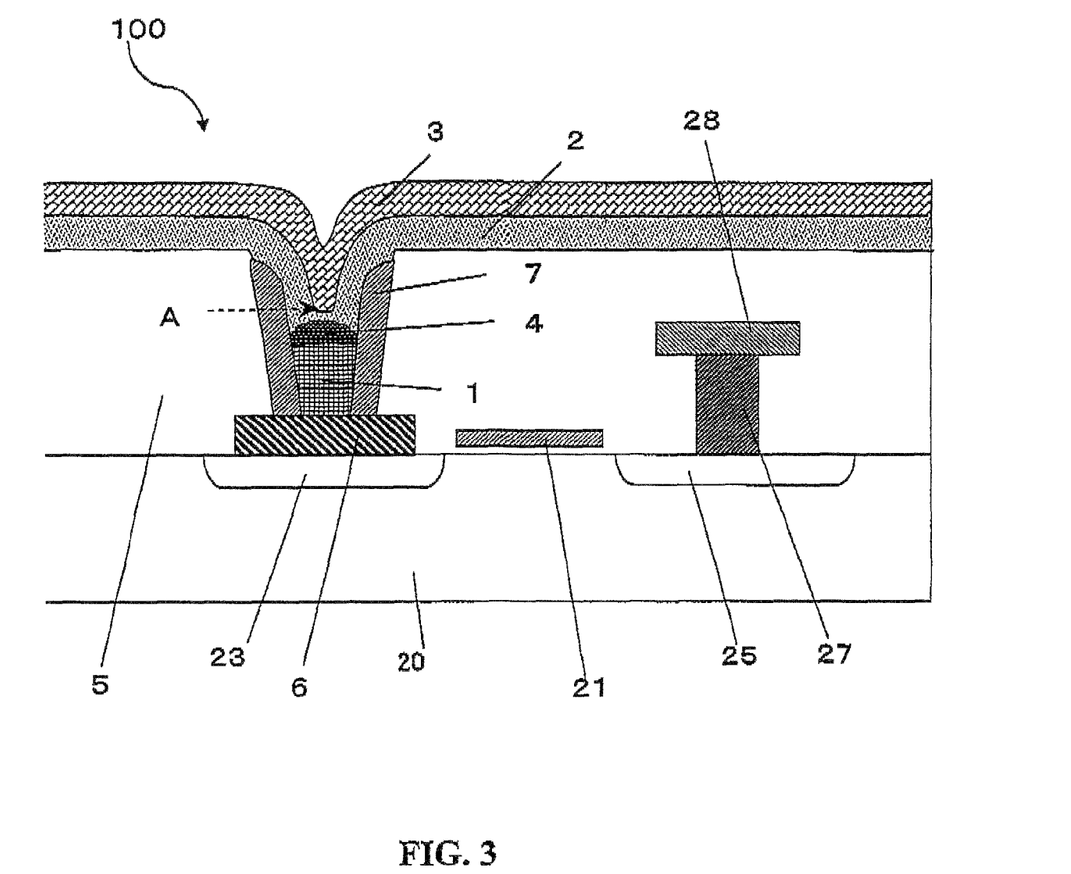
FIG. 3 is a cross-sectional view of a phase-change memory cell according to a first exemplary embodiment of the present invention.

FIG. 3 is a cross-sectional view showing a phase-change memory cell according to a first exemplary embodiment of the present invention.

As shown in FIG. 3, a memory cell 100 includes a lower electrode 6 formed on a substrate 20, a side-wall insulating film 7 on the side wall of a contact hole which is formed through an interlayer insulating film 5 formed on the substrate to cover the lower electrode 6, a heater 1 formed in the interior of the contact hole defined by the side-wall insulating film 7, a phase-change film 2 formed in contact with the heater 1, and an upper electrode 3 formed on the phase-change film 2. The height of the side-wall insulating film 7 measured from the bottom of the contact hole is smaller than the depth of the contact hole. The height of the heater 1 is smaller than the height of the side-wall insulating film 7. Desirably, the difference in height between the side-wall insulating film 7 and the heater 1 is set to be greater than the thickness of the bottom part of the phase-change film 2 formed in the interior of the contact hole. The lower electrode 6 is located on a source region 23 of a cell transistor formed in the substrate 20 and is electrically connected thereto. The cell transistor includes a drain region 25 and a gate 21, in addition to the source region 23. The drain region 25 is connected to a GND wiring 28 by means of a plug 27 electrically connected to the drain region. The upper electrode 3 is connected to a bit line 3, while the gate 21 is connected to a word line. Activation of the word line turns on the cell transistor, and the memory cell is operated by a signal applied to the upper electrode through the GND wiring 28 and the bit line 3.

Description will be made of structures of a phase-change material layer and the heater constituting the principal part in the memory cell of the exemplary embodiment and a manufacture method thereof, with reference to FIGS. 4 to 8.

Figure 4:
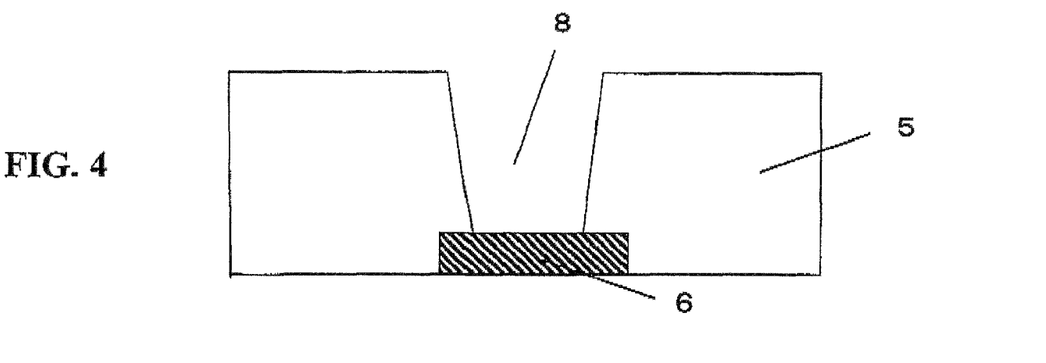
FIG. 4 is a partial cross-sectional view for explaining a part of a manufacturing process of the memory cell according to the first exemplary embodiment.
Figure 5:
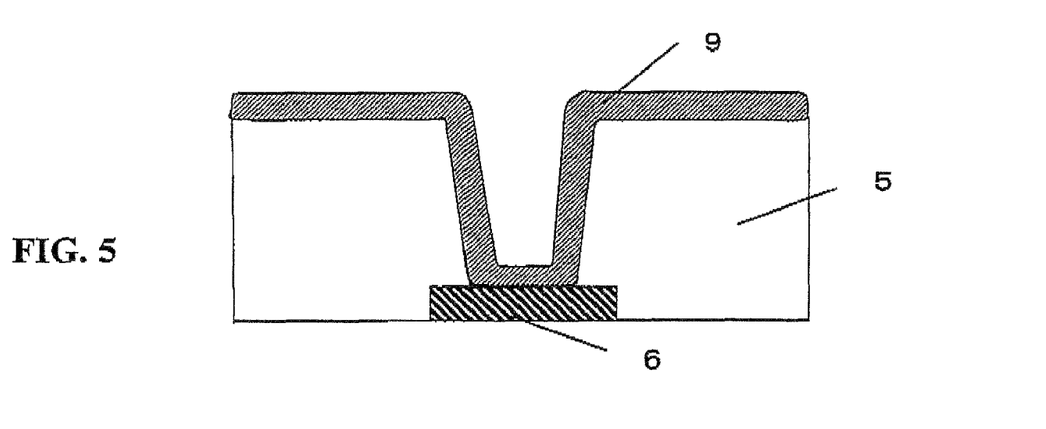
FIG. 5 is a partial cross-sectional view for explaining a process subsequent to the process shown in FIG. 4.

FIGS. 4 to 8 are partial cross-sectional views showing manufacturing steps of a memory cell. Since the manufacture of a cell transistor is well known, description thereof will be omitted, and the following description will be made on the assumption that formation of a cell transistor has been completed. As shown in FIG. 4, a contact hole 8 is formed through an interlayer insulating film 5 covering a lower electrode 6 formed on a substrate (not shown) such that the lower electrode 6 is exposed. The substrate has a cell transistor formed therein. For example, the interlayer insulating film 5 is a silicon oxide film ($SiO_2$), and the contact hole 8 has a diameter of 120 nm. Subsequently, a nitride film 9 to be a side-wall insulating film is deposited to a thickness of 30 nm (FIG. 5).

Figure 6:
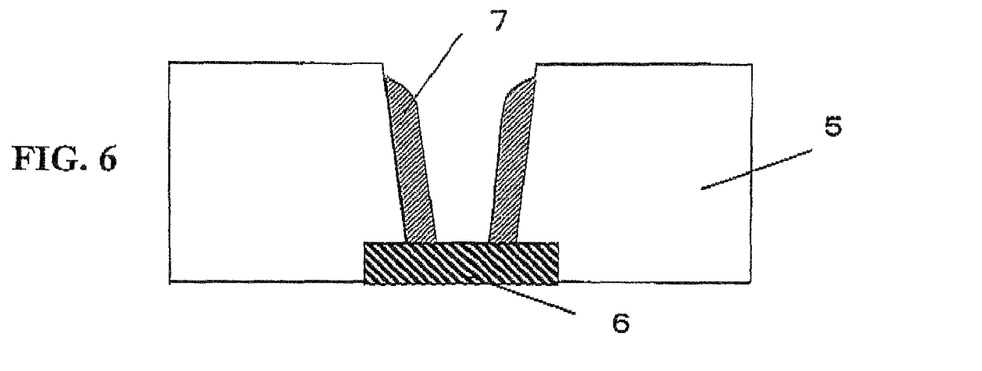
FIG. 6 is a partial cross-sectional view for explaining a process subsequent to the process shown in FIG. 5.

This nitride film 9 is then etched back to form a side-wall nitride film 7 (FIG. 6). The level of the top surface of the side-wall nitride film 7 on the side in contact with the interlayer insulating film 5 may be the same as or slightly lower than the level of the top surface of the interlayer insulating film 5. However, it is preferable that the corner of the side-wall nitride film 7 is gently tapered toward the inside of the contact hole. In order to obtain this gently tapered shape, it is preferable that the etch-back process is performed slightly more than a normal process so that the level of the top surface of the side-wall nitride film 7 is slightly lower than the level of the top surface of the interlayer insulating film 5.

Figure 7:
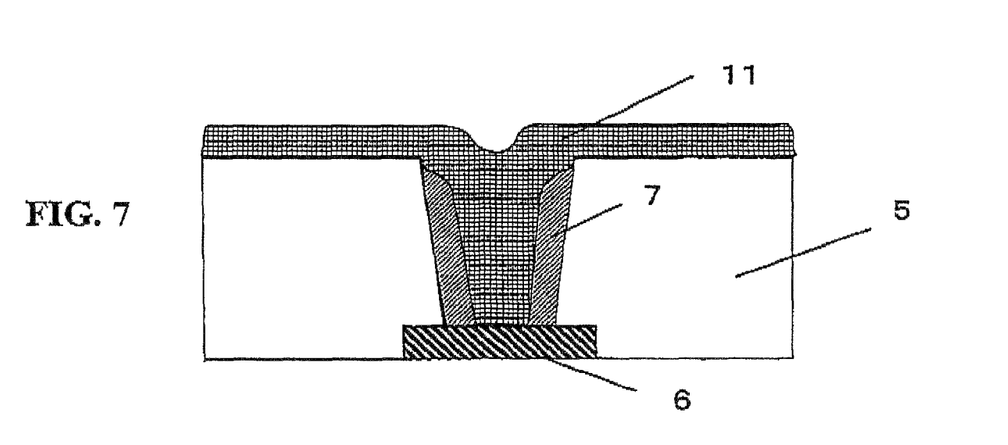
FIG. 7 is a partial cross-sectional view for explaining a process subsequent to the process shown in FIG. 6.
Figure 8:
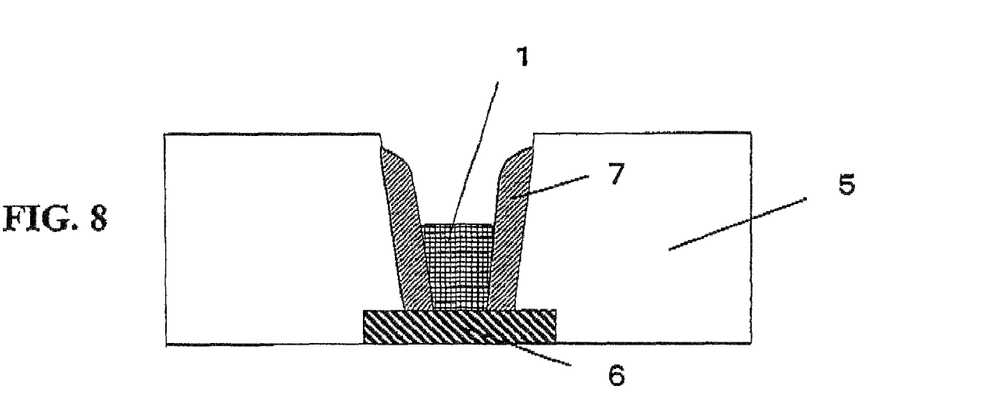
FIG. 8 is a partial cross-sectional view for explaining a process subsequent to the process shown in FIG. 7.

Subsequently a heater electrode film 11 to be a heater is formed by depositing TiN (titanium nitride) or TiSiN (titanium silicon nitride), or a laminated film of these (FIG. 7). The heater electrode film 11 is then etched to form a heater 1. During this etch-back process, the heater electrode film 11 inside the contact hole is also etched away to leave a part thereof as the heater 1 (FIG. 8). The heater 1 is formed such that the level of the top surface of the heater 1 is lower that level of the top surface of the side-wall nitride film 7 by an extent equal to or greater than a thickness of a phase-change film to be formed later. The heater 1 is thus formed in an area surrounded by the side-wall nitride film 7 within the contact hole. The formation of the side-wall nitride film 7 in the contact hole 8 decreases the diameter of the heater 1, whereby the current density flowing to the heater can be increased.

Subsequently, a phase-change film 2 and an upper electrode 3 are sequentially deposited to obtain a memory cell structure according to the first exemplary embodiment shown in FIG. 3. The level of the top surface of the heater 1 is set lower than the level of the top surface of the side-wall nitride film 7 by an extent equal to or greater than the thickness of the phase-change film (e g. 20 nm). Therefore the level of the top surface in a bottom portion of the phase-change film 2 deposited in the contact hole into a cylindrical shape (indicated by A in FIG. 3) is lower than the level of the top surface of the side-wall nitride film 7. This enables a phase-change region 4 of the phase-change film 2 to be located in an area lower than the level of the top surface of the side-wall insulating film. Thus, the phase-change region 4 is surrounded by the side-wall nitride film 7. This means that both the heater 1 and the phase-change region 4 heated to high temperature are surrounded by the side-wall nitride film 7 in the phase-change memory.

The phase-change film 2, having a thickness of 20 nm for example, may be formed of a material containing at least two or more elements selected from among germanium (Ge), antimony (Sb), tellurium (Te), selenium (Se), gallium (Ga), and indium (In). For example, a material such as gallium antimonide (GaSb), indium antimonide (InSb), indium selenite (InSe), antimony telluride ($Sb_2Te_3$), germanium telluride (GeTe), $Ge_2Sb_2Te_5$, InSbTe, GaSeTe, $SnSb_2Te_4$, InSbGe, or the like may be used. The upper electrode 3 is formed by a conductor film of tungsten (WV), aluminum (Al), or the like Although a passivation film is formed on the top surface of the upper electrode subsequent to the state shown in FIG. 5, the illustration thereof is omitted.

In the phase-change memory according to this exemplary embodiment, the diameter of the heater 1 is reduced by the formation of the side-wall nitride film 7 in the contact hole 8. Additionally, the level of the top surface of the heater 1 is located lower than the level of the top surface of the side-wall nitride film 7 by an extent equal to or greater than the thickness of the phase-change film. According to this configuration, the phase-change region 4 is formed in the area surrounded by the side-wall nitride film 7 when electric current is supplied between the upper electrode 3 and the lower electrode 6 to cause the heater 1 to generate heat. This means that the region heated to high temperature by the heat generation is located inside the contact hole 8 and in the area surrounded by the side-wall nitride film 7. This makes it possible to suppress the thermal diffusion and to improve the heat generation efficiency, and hence makes it possible to cause the phase change to occur with a small amount of rewrite current. According to the prior art, only the heater is located inside the area surrounded by the side-wall insulating film, while the phase-change film is located outside the area surrounded by the side-wall insulating film. Therefore, the current density is reduced and the heat is diffused, inducing a problem of deterioration of efficiency. In contrast, the configuration of the present exemplary embodiment invention is able to solve these problems.

A semiconductor device and a manufacture method thereof according to second exemplary embodiment will be described. A phase-change memory cell according to the second exemplary embodiment has a heater formed in a cylindrical shape so that the contact surface between the heater and a phase-change film is of a ring shape.

Figure 9:
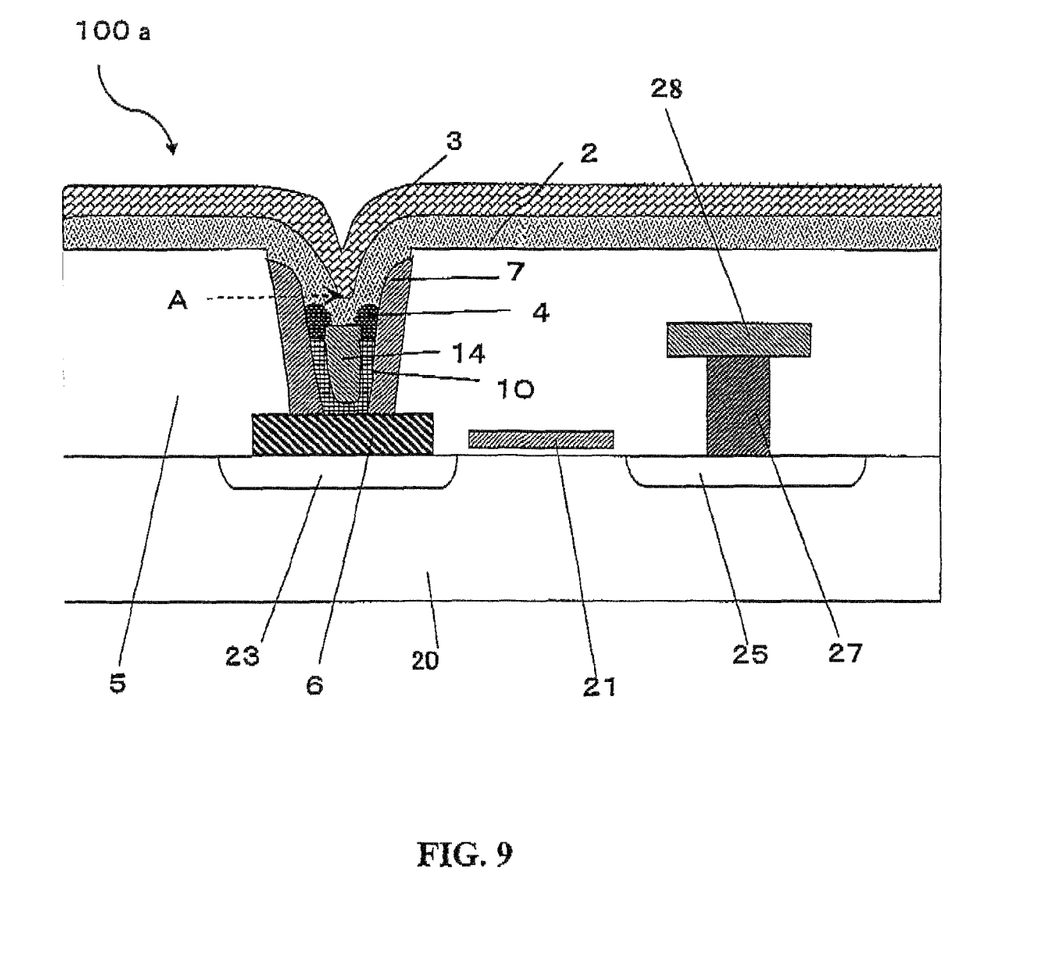
FIG. 9 is a cross-sectional view showing a phase-change memory cell according to a second exemplary embodiment.

Referring to FIG. 9, a phase-change memory cell 100a, according to the second exemplary embodiment, includes a lower electrode 6 formed on a substrate 20, and a side-wall insulating film 7 formed on a side wall of a contact hole formed through an interlayer insulating film 5 which is formed on the substrate so as to cover the lower electrode. The memory cell further includes a heater 10 formed in a substantially cylindrical shape in the interior of the contact hole defined by the side-wall insulating film 7. The cylindrical heater has a hollow structure with a closed bottom. The bottom face of the cylindrical heater 10 is in contact with the lower electrode 6. A heater insulating film 14 is buried in the interior of the cylindrical heater. A phase-change film 2 is formed to be in contact with the upper part of the heater 10 and to be located on the heater insulating film 14. An upper electrode 3 is formed on the phase-change film 2. The height of the side-wall insulating film 7 measured from the bottom of the contact hole is smaller than the depth of the contact hole. The heater 10 is formed to have a smaller height than the side-wall insulating film 7. Desirably, the difference in height between the side-wall insulating film 7 and the heater 10 is set greater than the thickness of the bottom part of the phase-change film 2 formed in the interior of the contact hole.

The lower electrode 6 is located on a source region 23 of a cell transistor formed in the substrate 20 and electrically connected thereto. The cell transistor includes a drain region 25 and a gate 21 in addition to the source region 23. The drain region 25 is connected to a GND wiring 28 via a plug 27 electrically connected to the drain region. The upper electrode 3 is connected to a bit line 3, and the gate 21 is connected to a word line. Activation of the word line turns on the cell transistor, and the memory cell is operated by a signal applied to the upper electrode 2 through the GND wiring 28 and the bit line.

Description will be made of structures of the phase-change material layer and the heater in the memory cell constituting the principal feature of the semiconductor device according to the second exemplary embodiment, and a manufacture method thereof. The manufacture method of this memory cell is the same as that of the first exemplary embodiment up to a certain step. Therefore, the description of the like steps will be made with reference to FIGS. 4 to 6 used for the description of the first exemplary embodiment, and the subsequently steps will be described with reference to FIGS. 10 to 12.

These figures are partial cross-sectional views showing respective steps of the manufacture of a memory cell. Since the manufacture of a cell transistor is well known, the description thereof will be omitted. The following description will be made on the assumption that formation of a cell transistor has been completed. As shown in FIG. 4, a contact hole 8 is formed through an interlayer insulating film 5 covering a lower electrode 6 formed on a substrate (not shown) having a cell transistor formed therein. A nitride film 9 is then deposited on the entire surface of the structure shown in FIG. 4 (FIG. 5). The nitride film 9 is then etched back to form a side-wall nitride film 7 (FIG. 6). The steps up to the formation of the side-wall nitride film 7 are the same as the first exemplary embodiment, and hence detailed description thereof will be omitted.

Figure 10:
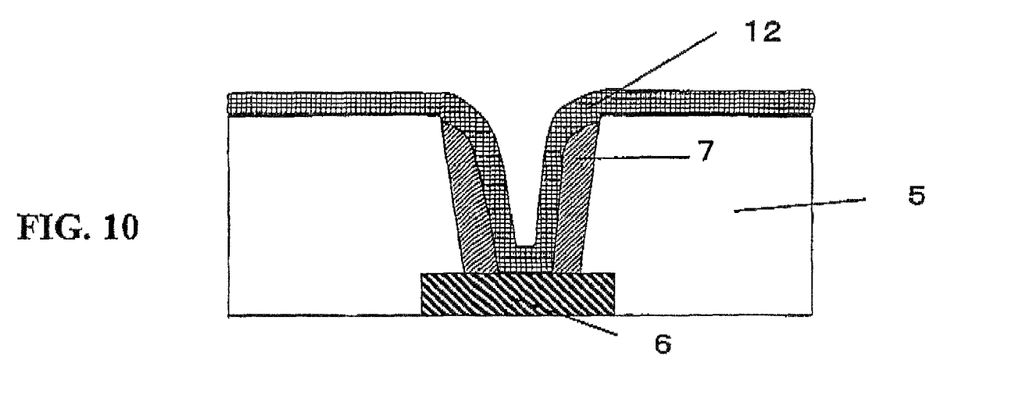
FIG. 10 is a partial cross-sectional view for explaining a part of a manufacturing process of the memory cell according to the second embodiment.
Figure 11:
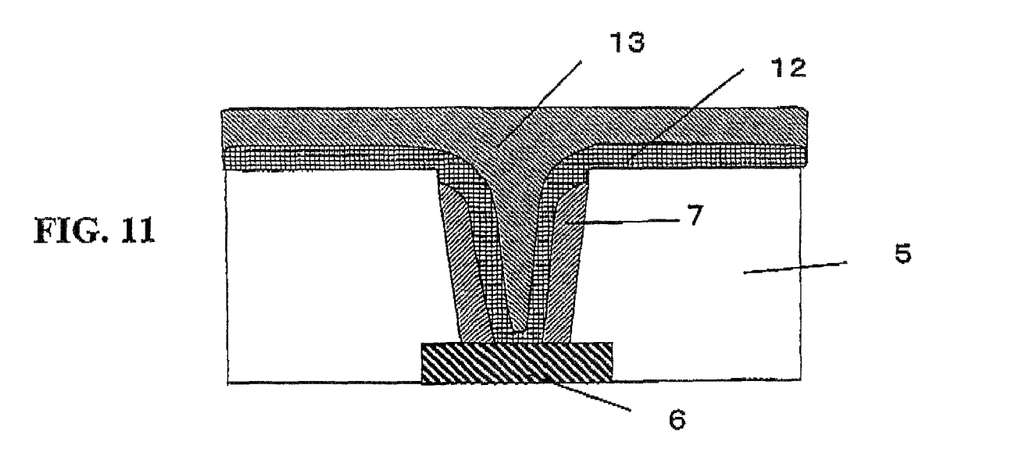
FIG. 11 is a partial cross-sectional view for explaining a process subsequent to the process shown FIG. 10.

As shown in FIG. 10, a heater electrode film 12 is formed by depositing TiN (titanium nitride) or TiSiN (titanium silicon nitride), or a laminated film of these. Unlike the first exemplary embodiment, this heater electrode film 12 is formed to have such a thickness that the interior of the contact hole is not entirely filled. In the first exemplary embodiment, the interior of the contact hole is entirely filled with the heater electrode film 11. However, in the second exemplary embodiment, the interior of the contact hole is not entirely filled with the heater electrode film. The thickness of the heater electrode film 12 is about 10 nm, for example. A buried insulating film 13 is then deposited in the remaining contact hole, so that the interior of the contact hole is entirely filled.

Figure 12:
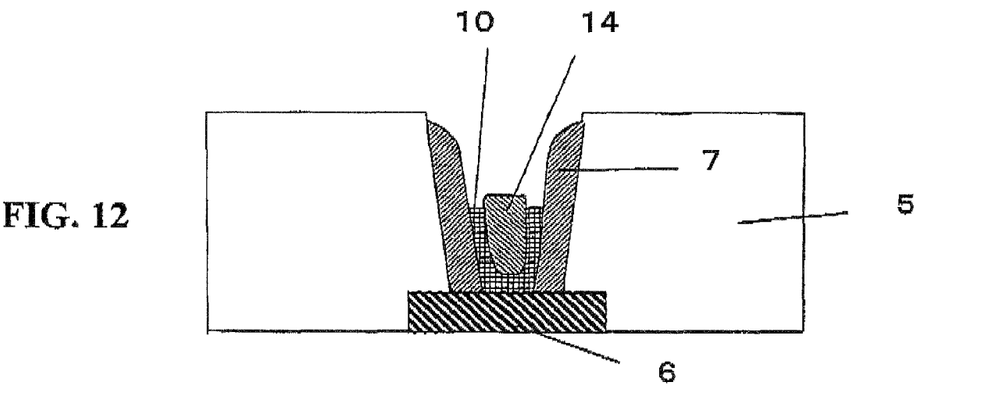
FIG. 12 is a partial cross-sectional view for explaining a process subsequent to the process shown FIG. 11.

Subsequently, as shown in FIG. 12, the insulating film 13 and the heater electrode film 12 are etched back so as to leave them only in the interior of the contact hole, whereby a heater insulating film 14 and a heater 10 are formed. This formation is done such that the levels of the top surfaces of the heater insulating film 14 and heater 10 are lower than the level of the top surface of the side-wall nitride film 7. The levels of the top surfaces of the heater insulating film 14 and heater 10 is lower than the level of the top surface of the side-wall nitride film 7 by an extent equal to or greater than a thickness of a phase-change film to be formed later.

The levels of the top surfaces of the heater insulating film 14 and heater may be the same, or the level of the top surface of the heater insulating film 14 may be higher than the level of the top surface of the heater 10. In this case, the level of the top surface of the heater 10 should be lower than the level of the top surface of the side-wall nitride film 7 by an extent equal to or greater than the thickness of the phase-change film to be formed later. As a result of such low formation of the heater 10, a recess is formed in the contact hole. This recess is filled with the phase-change film to be described later. Thus, the contact surface between the heater 10 and the phase-change film 2 is formed within the recess, enabling further concentration of the electric current and heat. Therefore, it is more preferable that the level of the top surface of the heater insulating film 14 is higher than the level of the top surface of the heater 10.

Subsequently, a phase-change material 2 and an upper electrode 3 are sequentially deposited to obtain the memory cell structure according to the second exemplary embodiment of the present invention shown in FIG. 9. The phase-change film 2 is deposited on the top surface of the interlayer insulating film 5 and in the contact hole so as to form a cylindrical shape in the contact hole. The level of the upper surface of the bottom portion of the phase-change film 2 deposited in a cylindrical shape inside the contact hole (indicated by A in FIG. 9) is lower than the level of the top surface of the side-wall nitride film 7. In other words, the formation is conducted such that a phase-change region 4 formed in the phase-change film 2 is located in an area surrounded by the side-wall nitride film 7.

Since the heater 10 has a ring shape, the contact surface with the phase-change film is small. Therefore, the current density at this contact surface is increased, enabling efficient generation of heat, if the level of the top surface of the heater 10 is lower than the level of the top surface of the heater insulating film 14, the recess in the heater 10 is filled with the phase-change film 2. The formation of the phase-change film 2 in the recess reduces the thermal diffusion, enabling even more efficient generation of heat. Although a passivation film is formed on the top surface of the upper electrode subsequent to the state shown in FIG. 9, the illustration thereof is omitted.

In this phase-change memory, the phase-change region 4 is formed in a ring shape inside the contact hole when electric current is supplied between the upper electrode 3 and the lower electrode 6 to cause the heater 10 to generate heat. This means that a region heated to high temperature is located inside the contact hole 8 and in the area surrounded by the side-wall nitride film 7. Therefore, the thermal diffusion is suppressed and the efficiency of heat generation is improved. Further, when the level of the top surface of the heater 10 is lower than the level of the top surface of the heater insulating film 14, the phase-change region 4 is formed principally in the phase-change film 2 formed inside the recess. This suppresses the thermal diffusion and improves the efficiency of heat generation, enabling the phase change to occur with a small amount of rewrite current.

In the phase-change memory according to the exemplary embodiments, a side-wall insulating film is formed in a contact hole formed to establish connection with a lower electrode, and a heater is formed on the inside of the side-wall insulating film. The level of the top surface of the heater is set lower than the level of the top surface of the side-wall insulating film by an extent equal to or greater than the thickness of the phase-change film. The level of the top surface of the heater is set low so that the contact surface between the heater and the phase-change film, and the region heated to high temperature such as the phase-change region are located in the area surrounded by the side-wall insulating film. This configuration makes it possible to prevent the thermal diffusion and to improve the efficiency of heat generation. As a result, a semiconductor device having a phase-change memory can be rewritten efficiently with a small amount of rewrite current.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claim is:

1. A semiconductor device comprising:
   an interlayer insulating film formed over a semiconductor substrate so as to cover a lower electrode;
   a side-wall Insulating film formed on a side wall of a contact hole having a depth reaching the lower electrode through the interlayer insulating film;
   a heater formed in the interior of the contact hole defined by the sidewall insulating film;
   a phase-change film formed in contact with the top surface of the heater; and
   an upper electrode formed in contact with the top surface of the phase-change film, the heater being formed such that it is connected to the lower electrode at the bottom surface thereof, and the level of the top surface of the heater is lower than the level of the top surface of the side-wall insulating film.

2. The semiconductor device according to claim 1, wherein the level of the top surface of the heater is lower than the level of the top surface of the side-wall insulating film by an extent equal to or greater than a thickness of the phase-change film.

3. The semiconductor device according to claim 1 wherein the level of the top surface of the phase-change film formed to be in contact with the top surface of the heater is partially lower than the level of the top surface of the side-wall insulating film.

4. The semiconductor device according to claim 1, wherein a phase-change region, where phase change occurs, is formed in the phase-change film in an area located lower than the revel of the top surface of the side-wall insulating film.

5. The semiconductor device according to claim 1, wherein the level of the top surface of the side-wall insulating film is lower than the level of the top surface of the interlayer insulating film.

6. The semiconductor device according to claim 1, wherein the heater is of a cylindrical shape and has an insulating film inside the cylinder.

7. The semiconductor device according to claim 6, wherein the level of the top surface of the insulating film is higher than the level of the top surface of the heater and lower than the level of the top surface of the side-wall insulating film.

8. The semiconductor device according to claim 7, wherein a part of the phase-change film is disposed into the contact hole, a lower surface of the part of the phase-change film being contact with both the top surface and a side surface of the side-wall insulating film in the contact hole, and a part of the upper electrode is disposed into the contact hole, a lower surface of the part of the upper electrode being contact with a top surface of the phase-change film in the contact hole.

9. The semiconductor device according to claim 1, wherein a part of the phase-change film is disposed into the contact hole, a lower surface of the part of the phase-change film being contact with both the top surface and a side surface of the side-wall insulating film in the contact hole, and a part of the upper electrode is disposed into the contact hole, a lower surface of the part of the upper electrode being contact with a top surface of the phase-change film in the contact hole.

10. A semiconductor device having a memory cell, comprising:
- a semiconductor substrate;
- a lower electrode over the semiconductor substrate;
- an interlayer insulating film over the semiconductor substrate and the lower electrode;
- an opening formed in the interlayer insulating film to a depth reaching the lower electrode;
- a side-wall insulating film formed on a side wall of the opening;
- a heater being in contact with the lower electrode at the bottom surface of the remaining opening inside the side-wall insulating film and buried in the remaining opening such that the height of the heater is lower than that of the side-wall insulating film; and
- a phase-change material film formed to be in contact with the top surface of the heater.

11. The semiconductor device according to claim 10, wherein the height of the heater is lower than the height of the side-wall insulating film by an extent equal to or greater than a thickness of the phase-change film.

12. The semiconductor device according to claim 10, wherein the upper surface of the bottom portion of the phase-change film located in the remaining opening is formed at a level lower than the height of the side-wall insulating film.

13. The semiconductor device according to claim 10, wherein the heater is of a cylindrical shape the bottom of which is in contact with the lower electrode, the interior of the cylindrical shape being filled with an insulating material, and the phase-change material being formed in contact with the cylindrical heater and the insulating material.

14. The semiconductor device according to claim 13, wherein the level of the top surface of the insulating material is higher than the level of the top surface of the heater and lower than the level of the top surface of the sidewall insulating film.

* * * * *